US009945983B2

(12) United States Patent
Lu (10) Patent No.: US 9,945,983 B2
(45) Date of Patent: Apr. 17, 2018

(54) SILICON TITANIUM OXIDE COATING, COATED ARTICLE INCLUDING SILICON TITANIUM OXIDE COATING, AND METHOD OF MAKING THE SAME

(71) Applicant: Guardian Glass, LLC, Auburn Hills, MI (US)

(72) Inventor: Yiwei Lu, Ann Arbor, MI (US)

(73) Assignee: Guardian Glass, LLC, Auburn Hills, MI (US)

( * ) Notice: Subject to any disclaimer, the term of this patent is extended or adjusted under 35 U.S.C. 154(b) by 829 days.

(21) Appl. No.: 14/173,015

(22) Filed: Feb. 5, 2014

(65) Prior Publication Data

US 2014/0154488 A1 Jun. 5, 2014

Related U.S. Application Data

(60) Division of application No. 12/923,837, filed on Oct. 8, 2010, now Pat. No. 8,679,302, which is a (Continued)

(51) Int. Cl.
*C03C 17/34* (2006.01)
*G02B 1/115* (2015.01)
(Continued)

(52) U.S. Cl.
CPC ......... *G02B 1/115* (2013.01); *C03C 17/3417* (2013.01); *C03C 17/3423* (2013.01);
(Continued)

(58) Field of Classification Search
CPC ............ C03C 17/3417; C03C 17/3423; C03C 17/3435; C03C 2217/212;
(Continued)

(56) References Cited

U.S. PATENT DOCUMENTS 5,110,637 A 5/1992 Ando et al.
5,427,665 A 6/1995 Hartig et al.
(Continued)

FOREIGN PATENT DOCUMENTS

DE         41 02 469 A1    7/1992
DE   11 2006 003 106 T5  10/2008
(Continued)

OTHER PUBLICATIONS

U.S. Appl. No. 12/923,837, filed Oct. 8, 2010; Lu.
(Continued)

*Primary Examiner* — Rodney G McDonald
(74) *Attorney, Agent, or Firm* — Nixon & Vanderhye P.C.

(57) ABSTRACT

Certain example embodiments relate to a layer of or including $Ti_{1-x}Si_xO_y$, and/or a method of making the same. In certain example embodiments, the $Ti_{1-x}Si_xO_y$-based layer may be substoichiometric with respect to oxygen. In certain example embodiments of this invention, the layer may include $Ti_{1-x}Si_xO_y$, where x is from about 0.05 to 0.95 (more preferably from about 0.1 to 0.9, and even more preferably from about 0.2 to 0.8, and possibly from about 0.5 to 0.8) and y is from about 0.2 to 2 (more preferably from about 1 to 2, and even more preferably from about 1.5 to 2, and possibly from about 1.9 to 2). The layer may have an index of refraction of from about 1.6 to 1.9. The layer may also be used with a transparent conductive oxide in a transparent conductive coating.

6 Claims, 6 Drawing Sheets

Related U.S. Application Data continuation-in-part of application No. 11/272,448, filed on Nov. 14, 2005, now abandoned.

(51) Int. Cl.
*C23C 14/08* (2006.01)
*C23C 14/34* (2006.01)

(52) U.S. Cl.
CPC .......... *C03C 17/3435* (2013.01); *C23C 14/08* (2013.01); *C23C 14/3414* (2013.01); *C03C 2217/212* (2013.01); *C03C 2217/213* (2013.01); *C03C 2217/23* (2013.01); *C03C 2217/73* (2013.01); *C03C 2217/734* (2013.01); *C03C 2217/94* (2013.01); *C03C 2218/154* (2013.01); *C03C 2218/155* (2013.01); *C03C 2218/156* (2013.01); *Y10T 428/24975* (2015.01)

(58) Field of Classification Search
CPC .......... C03C 2217/213; C03C 2217/23; C03C 2217/73; C03C 2217/734; C03C 2217/94; C03C 2218/154; C03C 2218/15; C03C 2218/156; C03C 2218/155; C23C 14/08; C23C 14/3414; G02B 1/115
USPC ........................................................ 428/216
See application file for complete search history.

(56) References Cited

U.S. PATENT DOCUMENTS

| | | | |
|---|---|---|---|
| 5,470,452 A | 11/1995 | Dickey et al. | |
| 5,605,609 A | 2/1997 | Ando et al. | |
| 5,725,746 A | 3/1998 | Dickey et al. | |
| 6,074,730 A | 6/2000 | Laird et al. | |
| 6,309,753 B1 | 10/2001 | Grossman et al. | |
| 6,743,343 B2 | 6/2004 | Kida et al. | |
| 8,679,302 B2 | 3/2014 | Lu | |
| 2004/0163943 A1 | 8/2004 | Rietzel et al. | |
| 2007/0108043 A1 | 5/2007 | Lu | |
| 2007/0275252 A1 | 11/2007 | Krasnov | |
| 2010/0040892 A1 | 2/2010 | Krasnov et al. | |

FOREIGN PATENT DOCUMENTS

| | | |
|---|---|---|
| EP | 0 331 201 | 9/1989 |
| EP | 0 515 847 | 12/1992 |
| EP | 0 953 550 | 11/1999 |
| EP | 1 153 658 | 11/2001 |
| EP | 1 176 434 | 1/2002 |
| EP | 1 908 858 A1 | 4/2008 |
| JP | 05-214526 | 8/1993 |
| JP | 07-233469 | 9/1995 |
| JP | 8-158048 | 6/1996 |
| JP | 2001-316804 | 11/2001 |
| WO | WO 2007/013261 | 2/2007 |

OTHER PUBLICATIONS

U.S. Appl. No. 11/272,448, filed Nov. 14, 2005; Lu.
German Office Action dated Dec. 11, 2015 for DE Application No. 11 2006 003 106.6.
Metastable $TiSi_xN_yO_z$ Films of B1-Type Structure Prepared by the Arc Process; Kuznetsov et al., Thin Solid Films 279 (1996) pp. 75-81.
DE Office Action dated Feb. 14, 2018 for DE Application No. 11 2011 103 399.0.

SILICON TITANIUM OXIDE COATING, COATED ARTICLE INCLUDING SILICON TITANIUM OXIDE COATING, AND METHOD OF MAKING THE SAME

CROSS-REFERENCE TO RELATED APPLICATION

This application is a divisional of application Ser. No. 12/923,837, filed Oct. 8, 2010 (now U.S. Pat. No. 8,679,302), which is a continuation-in-part (CIP) of Ser. No. 11/272,448 filed Nov. 14, 2005 (Abandoned), the entire disclosures of which are all hereby incorporated herein by reference in this application.

FIELD OF THE INVENTION

Certain example embodiments of this invention relate to a layer of or including $Ti_{1-x}Si_xO_y$, and/or a method of making the same. In certain example embodiments, the layer may be deposited by a ceramic target. In certain example embodiments, the $Ti_{1-x}Si_xO_y$ may be substoichiometric with respect to oxygen. In certain example embodiments of this invention, the layer may be of or include $Ti_{1-x}Si_xO_y$ where x is from about 0.05 to 0.95 (more preferably from about 0.1 to 0.9, and even more preferably from about 0.2 to 0.8, and possibly from about 0.5 to 0.8) and y is from about 0.2 to 2 (more preferably from about 1.0 to 2, and even more preferably from about 1.5 to 2, and possibly from about 1.9 to 2). The layer may be deposited by a sputtering target comprising SiTiOx, and may be sputtered in an atmosphere of or including one or more of Ar, $O_2$ and/or $N_2$ gas(es) in certain example embodiments of this invention.

BACKGROUND AND SUMMARY OF EXAMPLE EMBODIMENTS OF THE INVENTION

Sputtering is known in the art as a technique for depositing onto substrates. For example, antireflective (AR), transparent conductive, and/or low-emissivity (low-E) coatings can be deposited onto a glass substrate by successively sputter-depositing one or more different layers onto the substrate. As an example, a low-F, coating may include in the following order: a glass substrate/$SnO_2$/ZnO/Ag/ZnO, where the Ag layer is an IR reflecting layer and the metal oxide layers are dielectric layers. In this example, one or more tin (Sn) targets may be used to sputter-deposit the base layer of $SnO_2$, one or more zinc (Zn) inclusive targets may be used to sputter-deposit the next layer of ZnO, an Ag target may be used to sputter-deposit the Ag layer, and so forth. As another example, a Ti or $TiO_x$ target may be used to sputter-deposit a layer of titanium oxide (e.g., $TiO_x$) on a substrate as a base layer or as some other layer in the stack in certain instances. The sputtering of each target is performed in a chamber housing a gaseous atmosphere (e.g., a mixture of Ar and O gases in the Sn, Ti and/or Zn target atmosphere(s)). In each sputtering chamber, sputtering gas discharge is maintained at a partial pressure less than atmospheric.

Example references discussing sputtering and devices used therefore include U.S. Pat. Nos. 5,427,665, 5,725,746, 6,743,343, and 2004/0163943, the entire disclosures of which are all hereby incorporated herein by reference.

A sputtering target (e.g., cylindrical rotatable magnetron sputtering target) typically includes a cathode tube within which is a magnet array. The cathode tube is often made of stainless steel or some other conductive material. The target material is formed on the tube by spraying, casting or pressing it onto the outer surface of the stainless steel cathode tube (optionally, a backing layer may be provided between the cathode tube and the target material layer). Each sputtering chamber includes one or more targets, and thus includes one or more of these cathode tubes. The cathode tube(s) may be held at a negative potential (e.g., −200 to −1500 V), and may be sputtered when rotating. Due to the negative biased potential on a target, ions from the sputtering gas discharge are accelerated into the target and dislodge, or sputter off, atoms of the target material. These atoms, in turn, together with the gas form the appropriate compound (e.g., tin oxide) that is directed to the substrate in order to form a thin film or layer of the same on the substrate.

There are different types of sputtering targets, such as planar magnetron and cylindrical rotatable magnetron targets. Planar magnetrons may have an array of magnets arranged in the form of a closed loop and mounted in a fixed position behind the target. A magnetic field in the formed of a closed loop is thus formed in front of the target. This field causes electrons from the discharge to be trapped in the field and travel in a pattern which creates a more intense ionization and higher sputtering rate.

In the case of rotating magnetron sputtering targets, the cathode tube and target material thereon are rotated over a magnetic array (that is often stationary) that defines the sputtering zone. Due to the rotation, different portions of the target are continually presented to the sputtering zone which results in a fairly uniform sputtering of the target material off of the tube.

Materials such as tin oxide, zinc oxide, and silicon nitride have an index of refraction (n) around 2, where $SiO_2$ has an index of refraction (n) of about 1.5 and $TiO_2$ has an index of refraction of about 2.4. There exists a need for materials, that can be used in low-E, transparent conductive, and/or AR coatings, that have an index of refraction (n) between these values (e.g., from about 1.6 to 1.9, or 2.1 to 2.3, for example). Materials with such index values would be advantageous in that they could be used to further reduce reflection in coated articles using low-E and/or AR coatings having the same. Alloys, mixes of reactive gases, or combinations of both alloys and mixtures of reactive gases may be used to generate thin films having desired properties that cannot be achieved using a single elemental metal approach, or a pure oxide approach.

The approach of using alloy metals as metal sputtering targets is limited by achievable small ranges of solid solution that restrict the ratio amount different materials. Metallic alloy metal targets also face low deposition rate problems in reactive sputtering when full oxide and/or nitride films are desired.

The approach of mixing gases when sputtering metal or Si targets is also problematic. Silicon and aluminum oxynitride can be tailored to obtain index values from 1.6 to 1.9. However, unfortunately, the conventional way of doing this is to use a Si or Al target and vary the gas flows of nitrogen and oxygen to gain the desired oxygen to nitrogen ratio in the resulting layer to adjust its index of refraction value. It is difficult to consistently adjust oxygen/nitrogen stoichiometry in the resulting layer in a desired manner by adjusting oxygen and nitrogen gas flows using a Si or Al target. Oxygen and nitrogen gases have different weights and it is difficult to get consistent predictable results by varying oxygen and nitrogen gas flows when using a Si target in sputtering silicon oxynitride. Therefore, layers deposited according to these methods may be difficult to make and/or have inconsistent and/or varying compositions.

In view of the above, it will be appreciated that there exists a need in the art for an improved technique to consistently form sputter-deposited layers having an index of refraction (n) in the range of from about 1.6 to 1.9. In particular, there exists a need for a technique that permits layers to be formed in a manner that allows a desired refraction index value in this range to be consistently achievable. Further, there is a need in the all for the resulting layer.

Certain example embodiments of this invention relate to a layer of or including $Ti_{1-x}Si_xO_y$ and/or a method of making a coated article including such a layer. In certain example embodiments, the layer may be deposited from a rotatable magnetron sputtering target, a stationary planar target, or the like. In certain example embodiments, the $Ti_{1-x}Si_xO_y$ may be substoichiometric with respect to oxygen. However, in other example embodiments, the $Ti_{1-x}Si_xO_y$ based layer may be fully oxidized. In certain example embodiments of this invention, the layer may be of or include $Ti_{1-x}Si_xO_y$ where x is from about 0.05 to 0.95 (more preferably from about 0.1 to 0.9, and even more preferably from about 0.2 to 0.8, and possibly from about 0.5 to 0.8) and y is from about 0.2 to 2 (more preferably from about 1 to 2, and even more preferably from about 1.5 to 2, and possibly from about 1.9 to 2). The layer may be sputter-deposited in an atmosphere of or including one or more of Ar, $O_2$ and/or $N_2$ gas(es) in certain example embodiments of this invention. Other materials may be provided in the target in alternative example embodiments of this invention.

Depositing titanium silicon oxide-inclusive layers from a target including at least silicon and titanium may permit layers with tunable indices of refraction (n) to be consistently achieved by sputter deposition. By adjusting the Ti and Si amounts in the target (e.g., the Ti/Si ratio in the target itself), layers of or including $TiSiO_x$ can be formed by sputter-deposition and can achieve consist desired index values (n) (e.g., where n is from about 1.5 to 2.0, or 1.6 to 1.9). For example, the more Si in the target, the lower the index of refraction (n) value of the resulting sputter-deposited layer. Likewise, the more Ti in the target (and thus the less Si), the higher the index of refraction (n) value of the resulting sputter-deposited layer. Thus, an improved technique is provided to consistently form sputter-deposited thin film layers having an index of refraction (n) in the range of from about 1.6 to 1.9. In particular, a technique is provided that permits layers to be sputter-deposited in a manner that allows a desired refraction index (n) value in this range to be consistently achievable. While gas flows may be adjusted to alter or tailor the index (n) value of the resulting layer, the index (n) value of the resulting layer may be adjusted by adjusting the Ti/Si ratio in the target itself.

The combination of Ti and Si in the target is advantageous in that Si and Ti form a suitable alloy. In certain example embodiments, when a ceramic target including Ti and Si is used, the amounts of Ti and Si can be varied to allow the desired index (n) value to be obtained in the resulting layer. Moreover, the ceramic nature of the sputtering target is advantageous in that it permits higher sputtering rates to be achieved. The oxygen in the target is stoichiometric (or close to stoichiometric) in certain example embodiments of this invention. Further, in certain example embodiments, the silicon oxide in the target has a higher sputter rate than the titanium oxide in the target. Therefore, in certain example embodiments, the ratio of Si to Ti in the film will be higher than the ratio of Si to Ti in the target itself. In other example embodiments, a titanium silicon oxide-inclusive layer may be formed through use of a metallic target, sputtered in the presence of oxygen and/or other gases.

In certain example embodiments of this invention, there is provided a method for making a coated article, the method comprising sputter-depositing a first medium index layer comprising $Ti_{1-x}Si_xO_y$ on a glass substrate, where x is from about 0.05 to 0.95 and y is from about 0.2 to 1.95, wherein said medium index layer comprising $Ti_{1-x}Si_xO_y$ is sputter-deposited by a target comprising Si and Ti, wherein the ratio of Si to Ti is from about 3:1 to 2:1, forming a high index layer over and contacting the medium index layer; forming a low index layer over and contacting the high index layer; and wherein the medium index layer has an index of refraction of from about 1.6 to 1.9, and a thickness of from about 30 to 70 nm, wherein the high index layer has an index of refraction of from about 2.0 to 2.4, and a thickness of from about 75 to 125 nm, wherein the low index layer has an index of refraction of from about 1.4 to 1.6, and a thickness of from about 65 to 115 nm, and wherein the medium index layer, the high index layer, and the low index layer form an anti-reflective coating.

In certain example embodiments of this invention, there is provided a method of making a coated article, the method comprising: providing a target comprising Si and Ti, wherein the target comprises more Si than Ti (atomically); sputter-depositing a layer comprising $Ti_{1-x}Si_xO_y$ on a substrate by flowing argon and/or oxygen gas in a chamber where the target is located, so as to cause the layer comprising silicon oxide and titanium oxide to be formed on the substrate, where x is greater than about 0.5, and y is less than or equal to 2; forming a layer consisting essentially of titanium oxide over and contacting the layer comprising $Ti_{1-x}Si_xO_y$; forming a layer consisting essentially of silicon oxide over and contact the layer consisting essentially of titanium oxide; wherein the layer consisting essentially of titanium oxide has an index of refraction that is the higher than that of the layer comprising $Ti_{1-x}Si_xO_y$, and the layer comprising $Ti_{1-x}Si_xO_y$ has an index of refraction higher than the layer consisting essentially of silicon oxide, and wherein the three layers form an antireflective coating on the glass substrate.

In still further example embodiments of this invention, there is provided a coated article, where the coated article comprises an antireflection coating, wherein the anti-reflection coating comprises: a first layer having a medium index of refraction and comprising $Ti_{1-x}Si_xO_y$, where x is greater than or equal to 0.5, and having a thickness of from about 30 to 70 nm; a second layer having a comparatively higher index of refraction and comprising an oxide of titanium, and having a thickness of from about 80 to 110 nm; a third layer having an index of refraction lower than both the first and second layers, and comprising an oxide of silicon, having a thickness of from about 70 to 100 nm; and wherein the medium index layer is formed by sputter deposition from a ceramic target comprising a target material comprising titanium, silicon and oxygen, and has an index of refraction of from about 1.6 to 1.9.

In still further example embodiments, there is provided a method for making a coated article, the method comprising: forming a transparent conductive coating on a glass substrate, wherein the transparent conductive coating is formed by: sputter-depositing a layer comprising $Ti_{1-x}Si_xO_y$ on a glass substrate, where x is from about 0.05 to 0.95 and y is from about 1 to 2, wherein said layer comprising $Ti_{1-x}Si_xO_y$ is sputter-deposited by a target comprising Si and Ti; and forming a transparent conductive oxide layer over and contacting the layer comprising $Ti_{1-x}Si_xO_y$ wherein the TCO layer has a thickness of from about 200 to 400 nm; and wherein the layer comprising $Ti_{1-x}Si_xO_y$ has a thickness of from about 50 to 90 nm, and an index of refraction of from about 1.6 to 1.9.

BRIEF DESCRIPTION OF THE DRAWINGS

These and other features and advantages may be better and more completely understood by reference to the following detailed description of exemplary illustrative embodiments in conjunction with the drawings, of which.

DETAILED DESCRIPTION OF EXAMPLE EMBODIMENTS OF THE INVENTION

Performance of optical coatings such as low-E and/or antireflective (AR) coatings, especially multi-layered coatings for broadband applications, relies on precisely controlled layer thicknesses and optical properties (e.g., n and/or k) in each individual layer in the coating(s). Materials having unique properties, such as refractive index (n) and extinction coefficient (k), stress and adhesion to adjacent layers are chosen to optimize the coating performance with respect to reflection, color, durability, and/or the like. The target may be a rotating magnetron sputtering target in certain example embodiments although other types of target are also possible in other alternative embodiments. For example, a non-rotating target may be used instead and may be applicable to this invention. As an example, a drum coater may be designed in such a way that neither the target nor the drum holding the substrate rotates, but instead magnets in the target tube rotate.

Certain example embodiments of this invention relate to optical coating fabricating using sputtering target(s) of or including $Ti_{1-x}Si_xO_y$. Such targets can be fabricated into either planar or rotating magnetron targets in different example embodiments of this invention. The use of $Ti_{1-x}Si_xO_y$ as a target material permits sputtering targets to be made which can be used to sputter-deposit thin film layers with consistent and predictable optical properties (e.g., n and/or k), covering a large potential index of refraction (n) range and allowing excellent repeatability because the Ti/Si ratio in the target is pre-defined and fairly repeatable.

The use of such sputtering targets is advantageous in that a large index (n) range from about 2.35 (x=0.05) to 1.6 (x=0.9) can be achieved in a dielectric oxide based thin film layer(s) without suffering significant absorption loss in the visible wavelength range. Moreover, another example advantage is that consistent optical properties (e.g., n and/or k of a resulting thin film) can be substantially predefined by setting x to a desired value during target fabrication. Yet another example advantage is that a high sputter-deposition rate can be achieved due to the partially oxidized phase (y less than 2.0) in the target. The target may be fully oxidized in other example embodiments, though. In certain example embodiments, aluminum may be added to the target in order to increase the conductivity of the target when the target comprises fully or near-fully oxidized silicon titanium oxide. Further, yet another example advantage is that improved adhesion to an optional adjacent metal layer(s) (e.g., an Ag layer, or a NiCr layer), metal oxide layer, metal nitride layer, or metal oxynitride layer, can be achieved due to the formation of a silicide (Ti and Si) at the layer interface(s).

Certain example embodiments of this invention relate to a sputtering target of or including $Ti_{1-x}Si_xO_y$ and/or a method of making a coated article using such a sputtering target. In certain example embodiments, the target may be a rotatable magnetron sputtering target, a stationary planar target, or the like. In certain example embodiments, the $Ti_{1-x}Si_xO_y$ may be substoichiometric with respect to oxygen. In other example embodiments, it may be fully stoichiometric. In certain example embodiments of this invention, the target may be of or include $Ti_{1-x}Si_xO_y$ where x is from about 0.05 to 0.95 (more preferably from about 0.1 to 0.9, and even more preferably from about 0.2 to 0.8, and possibly from about 0.5 to 0.8) and y is from about 0.2 to 2 (more preferably from about 1 to 2, and even more preferably from about 1.5 to 2, and possibly from about 1.9 to 2). In certain example embodiments, y is greater than about 1.95 or 1.90. In other example embodiments, the target is doped with aluminum in order to achieve desired conductivity to facilitate DC, pulsed DC, or middle frequency (e.g., <200 kHz) AC magnetron sputtering. In certain example embodiments, y is at least 0.2 in order to maintain a desired deposition rate of the film during sputtering without a significant absorption loss in the visible range during reactive sputtering.

The sputtering target may be sputtered in an atmosphere of or including one or more of Ar, Kr, He, $O_2$ and/or $N_2$ gas(es) in certain example embodiments of this invention. Other materials may be provided in the target in alternative example embodiments of this invention.

Such a target may be used to permit layers with tunable indices of refraction (n) to be consistently achieved by sputter deposition. By adjusting the Ti and Si amounts in the target (e.g., the Ti/Si ratio in the target itself), layers of or including $TiSiO_x$ (e.g., where x is from about 1.5 to 2.0) can be formed by sputter-deposition and can achieve consist desired index values (n). For example, the more Si in the target, the lower the index of refraction (n) value of the resulting sputter-deposited layer. Likewise, the more Ti in the target (and thus the less Si), the higher the index of refraction (n) value of the resulting sputter-deposited layer. Thus, an improved technique is provided to consistently form sputter-deposited layers having an index of refraction (n) in the range of from about 1.6 to 2.35. In particular, a technique is provided that permits layers to be sputter-deposited in a manner that allows a desired refraction index (n) value in this range to be consistently achievable. While gas flows may be adjusted to alter or tailor the index (n) value of the resulting layer, another way to adjust the index (n) value of the resulting layer is to adjust the Ti/Si ratio in the target itself.

The combination of Ti and Si in the target is advantageous in that Si and Ti form a suitable alloy. Since a ceramic target is used, including Ti and Si, the amounts of Ti and Si can be varied to allow the desired index (n) value to be obtained in the resulting layer. Moreover, the ceramic nature of the sputtering target is advantageous in that it permits higher sputtering rates to be achieved. The oxygen in the target is substoichiometric in certain example embodiments of this invention.

Instead of Si, Al may be used to replace the Si in the target and the resulting sputter-deposited layer in certain example alternative embodiments of this invention. As another alternative, Al may be added to $Ti_{1-x}Si_xO_y$ targets as an additional material in certain example alternative embodiments of this invention. Adding Al to the target may allow the target to be more fully oxidized, which may result in a better or faster sputter rate without compromising the conductivity of the target. Other materials such as Zr, V, Hf, Nb, Ce, Sb, Bi, Zn, Sn and Mg may be used instead of Al in each of these respects in still further example embodiments of this invention. Moreover, as will be appreciated, nitrogen gas may also be used in the sputtering process in order to enhance absorption in both the UV and the visible ranges if desired. The addition of one or more of these elements may be used to improve durability, UV absorption, and/or adhesion to adjacent layer(s) in different example embodiments of this invention. In certain example embodiments, it is possible to add extra element(s) to achieved desired properties such as adhesion, stress and/or UV absorption without significantly adversely affecting the desired optical index value through adjustment of the Ti/Si ratio for instance. For example, adding Sb may increase not only UV absorption, but also index. The index may be brought back to a desired value by adding extra Si if desired.

Figure 1:
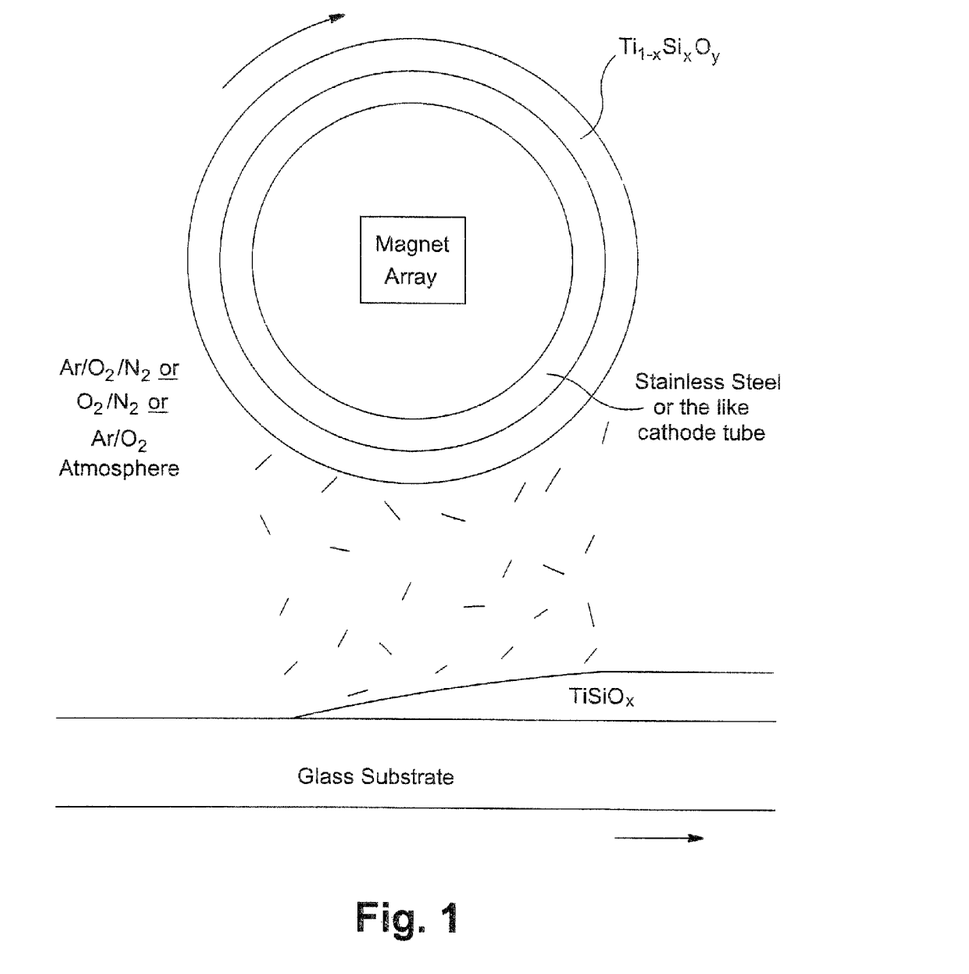
FIG. 1 is a cross sectional view of a sputtering target according to an example embodiment of this invention, being used in sputter-depositing a layer on a substrate.

FIG. 1 is a cross sectional view of a sputtering target according to an example embodiment of this invention, being used in sputter-depositing a thin film layer on a substrate according to an example embodiment of this invention. The rotatable magnetron sputtering target shown in FIG. 1 includes a cathode tube within which is a stationary magnet bar array. The cathode tube is often made of stainless steel or some other conductive material. The target material ($Ti_{1-x}Si_xO_y$ in the FIG. 1 embodiment) is formed on the cathode tube by spraying, casting or pressing it onto the outer surface of the stainless steel cathode tube (optionally, a backing layer, which may be conductive, may be provided between the cathode tube and the target material layer). Each sputtering chamber in a sputtering apparatus includes one or more targets, and thus includes one or more of these cathode tubes. Different targets are used to sputter-deposit different layers of a multi-layer low-E or AR coating. For cylindrical rotatable magnetron sputtering targets, the cathode tube(s) may be held at a negative potential (e.g., −200 to −1500 V), and may be sputtered when rotating. When a target is rotating for example, due to the negative biased potential on the target, ions from the sputtering gas (e.g., argon, oxygen and/or nitrogen) discharge are accelerated into the target and dislodge, or sputter off, atoms of the target material. These atoms, in turn, together with the gas form the appropriate compound (e.g., $TiSiO_x$) that is directed to the substrate in order to form a thin film or layer of the same (e.g., $TiSiO_x$ thin film shown in FIG. 1, where x may be about 2 in certain example instances, or may be slightly less than 2 in other example instances) on the substrate. The substrate may be a glass substrate as shown in FIG. 1 in certain example embodiments of this invention.

Sputter-deposited thin films of $TiSiO_x$ may be any suitable thickness in certain example embodiments of this invention. However, in certain example embodiments of this invention, the TiSiOx thin films may be sputter-deposited to a thickness on the substrate of from about 10 angstroms to 2.5 μm, more preferably from about 10 to 900 angstroms (Å), more preferably from about 50 to 800 angstroms, and most preferably from about 100 to 600 angstroms. Coated articles according to this invention may be used for any suitable purpose, but windows, fireplace glass, furniture table tops and the like are particularly preferred. In certain example embodiments of this invention, windows having coatings according to certain example embodiments of this invention may have a visible transmission of at least about 50%, more preferably of at least about 60%. Moreover, the sputter-deposited TiSiOx thin films are substantially transparent according to certain example embodiments of this invention.

Figure 2:
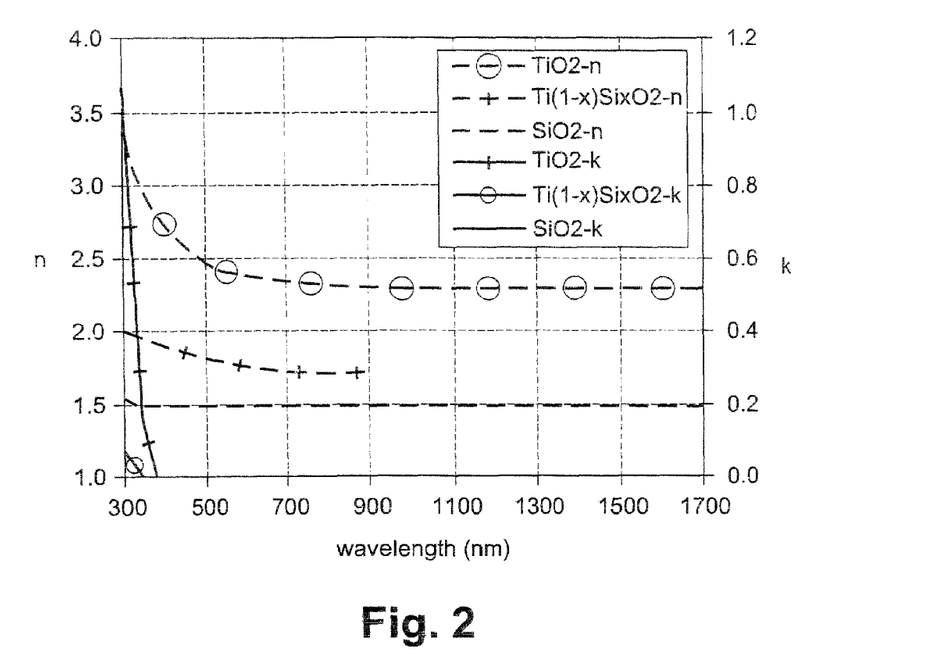
FIG. 2 is a graph illustrating optical properties (n and k) of $Ti_{1-x}Si_xO_2$ thin film layers according to example embodiments of this invention (compared to $TiO_2$ and $SiO_2$ thin film layers).
Figure 3:
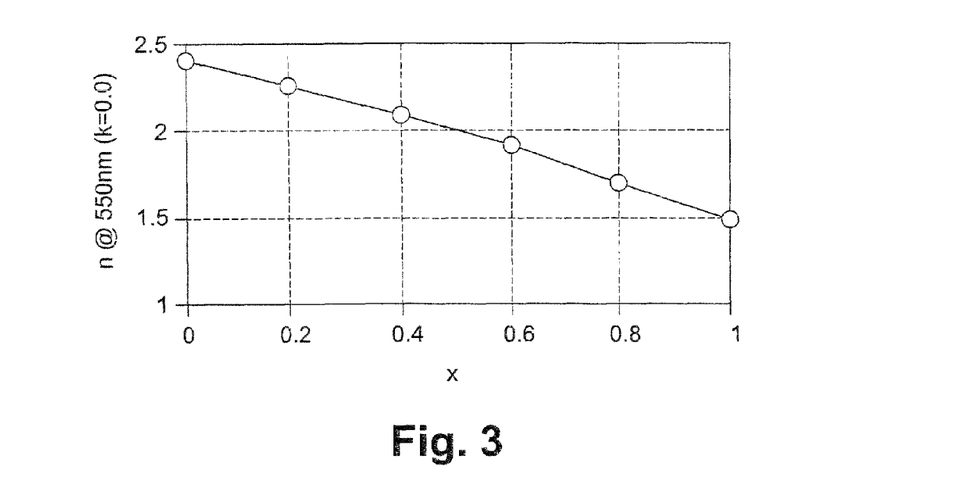
FIG. 3 is a graph illustrating refractive index (n) values at 550 nm of thin film $Ti_{1-x}Si_xO_2$ layers, as a function of different x values, showing that the index value (n) of the resulting sputter-deposited layer can be adjusted or tailored by adjusting the Ti/Si ratio in the target (i.e., by adjusting x in the target).

FIG. 2 is a graph illustrating optical properties (n and k) of $Ti_{1-x}Si_xO_2$ thin film layers according to example embodiments of this invention (compared to $TiO_2$ and $SiO_2$ thin film layers). FIG. 2 illustrates that $Ti_{1-x}Si_xO_2$ inclusive thin film layers made on a substrate (directly or indirectly on the substrate in different instances) have index of refraction (n) values between those of $TiO_2$ and $SiO_2$ thin film layers due to the presence of both titanium oxide and silicon oxide in the $Ti_{1-x}Si_xO_2$ inclusive thin film layers. FIG. 3 is a graph illustrating that the refractive index (n) value of thin film $Ti_{1-x}Si_xO_2$ layers can be varied as a function of different x values (i.e., changing the Ti/Si ratio in the target and thus in the sputter-deposited layer). In particular, FIG. 3 illustrates that the refractive index (n) value can be varied from about 1.6 to 2.35 in certain example embodiments of this invention, and can be varied from about 1.6 to about 1.9 in certain preferred example embodiments, as x is changed in the target.

Figure 4:
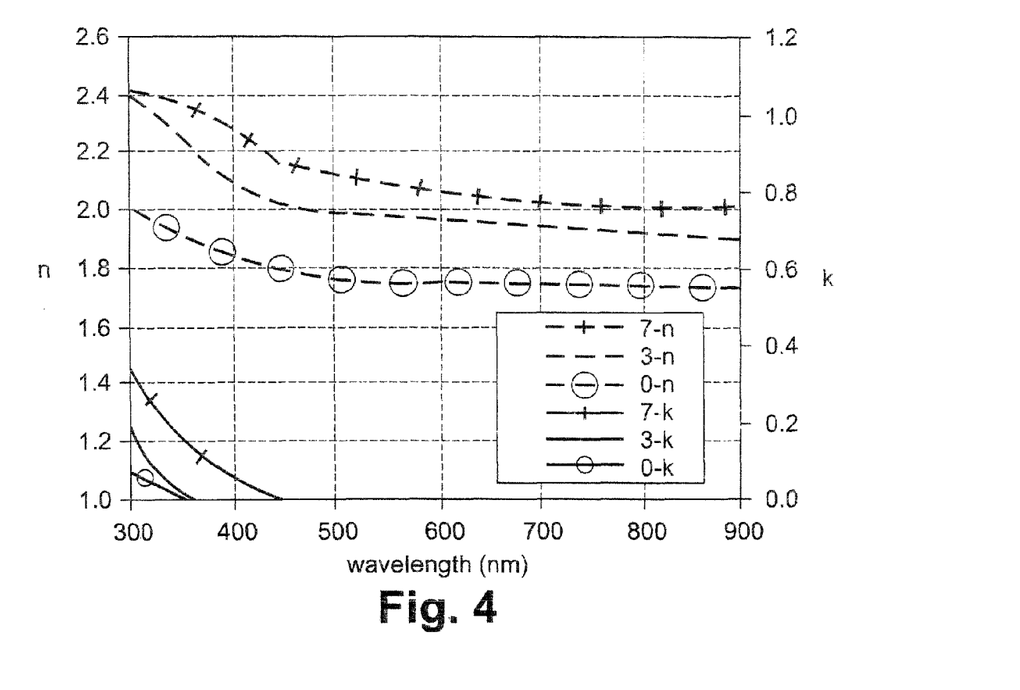
FIG. 4 is a graph illustrating optical properties (n and k) of thin film layers of $Ti_{1-x}Si_xO_{2-y}N_y$ (where x=0.75) according to example embodiments of this invention, as a function of adjusting the oxygen and nitrogen gas flows used when sputtering the layer (at the different $N_2/O_2$ ratios of 0, 3 and 7); illustrating that the increase of nitrogen gas in the sputtering process results in an increased index of refraction (n) value and absorption due to the increase in silicon nitride and titanium nitride in the resulting thin film layer.

In certain example embodiments of this invention, the gas used in the sputtering chamber where the $Ti_{1-x}Si_xO_y$ target is present may be a mixture of argon (Ar) and oxygen ($O_2$) gases. This results in a sputter-deposited thin film layer of $Ti_{1-x}Si_xO^2$ (if sufficient oxygen gas is used) on the glass substrate. However, it is possible to use other gas(es) as well. For example, a mixture of argon (Ar), oxygen ($O_2$) and nitrogen ($N_2$) gases may be used in the sputtering chamber in certain example embodiments of this invention. Different amounts of oxygen and nitrogen gases may be used in different example embodiments. It is also possible to use a mixture of Ar and N gas in the sputtering chamber(s) when sputtering the $Ti_{1-x}Si_xO_y$ target. It is also possible to use only argon, or only nitrogen gas in the sputtering chamber(s) when sputtering the $Ti_{1-x}Si_xO_y$ target. Other gases that can be used include He and/or Kr, for example. FIG. 4 is a graph illustrating optical properties (n and k) of thin film layers of $Ti_{1-x}Si_xO_{2-y}N_y$ (where x=0.75) according to example embodiments of this invention, as a function of adjusting the oxygen and nitrogen gas flows in the sputtering chamber when sputtering the $Ti_{1-x}Si_xO_y$ target to form a layer of TiSiON. In FIG. 4, n and k of the resulting sputter-deposited layer are illustrated for different $N_2/O_2$ gas flow ratios of 0, 3 and 7, illustrating that an increase of nitrogen gas (and thus a reduction in oxygen gas in the sputtering chamber) in the sputtering process results in an increased index of refraction (n) value and absorption due to the increase in silicon nitride and titanium nitride in the resulting thin film layer. Accordingly, as the amount of nitrogen gas decreases (and thus oxygen gas amounts increase in the sputtering chamber), the refractive index (n) and absorption coefficient (k) of the layer decreases due to more titanium oxide and silicon oxide in the resulting layer.

Figure 5:
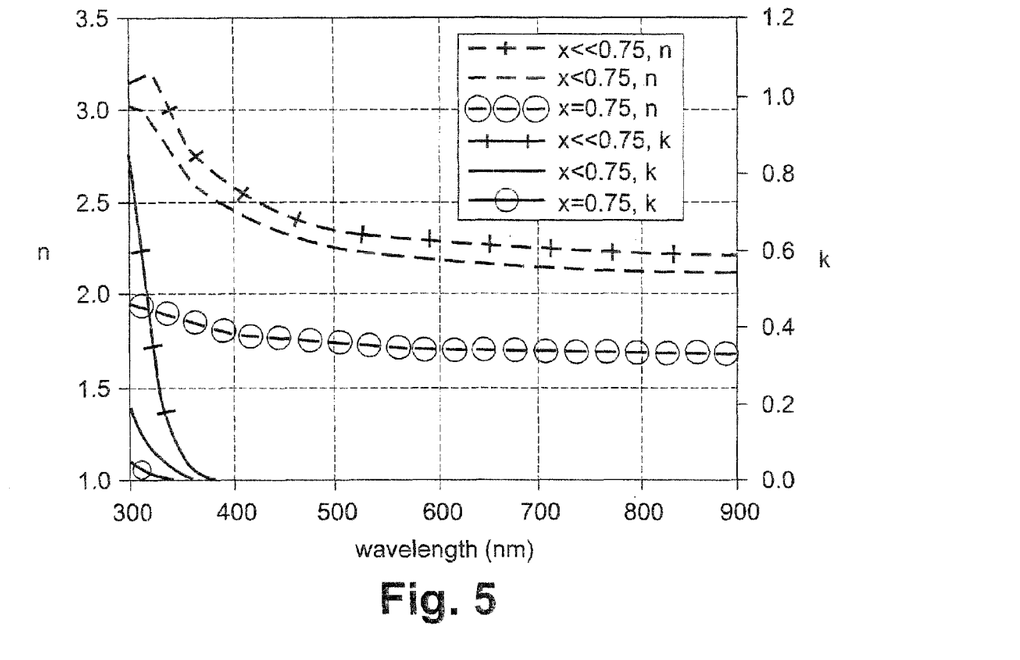
FIG. 5 is a graph illustrating optical properties (n and k) of thin film layers of $Ti_{1-x}Si_xO_{2-y}N_y$ (using a $N_2/O_2$ gas flow ratio of 0.48 during sputtering), with varying x values; the figure illustrate that decreasing x results in an increase in refractive index (n) values and absorption due to an increase in titanium oxide and titanium nitride in the thin film layer.

FIG. 5 is a graph illustrating optical properties (n and k) of thin film layers of $Ti_{1-x}Si_xO_{2-y}N_y$ (using a $N_2/O_2$ gas flow ratio of 0.48 in the sputtering chamber where the $Ti_{1-x}Si_xO_y$ target is located), with varying x values. FIG. 5 illustrates that decreasing x (i.e., reducing the amount of Si compared to Ti in the target and thus in the sputter-deposited layer) results in an increase in refractive index (n) values and absorption of the resulting layer due to an increase in titanium oxide and titanium nitride in the sputter-deposited thin film layer on the substrate. It is noted that instead of, or in addition to, adding nitrogen gas to the sputtering chamber during the sputtering of the $Ti_{1-x}Si_xO_y$ target, other metallic element(s) can be added to the target to modify the thin film properties. Using metallic elements in the target tends to result in thin film properties that are more predictable and repeatable.

Figure 6:
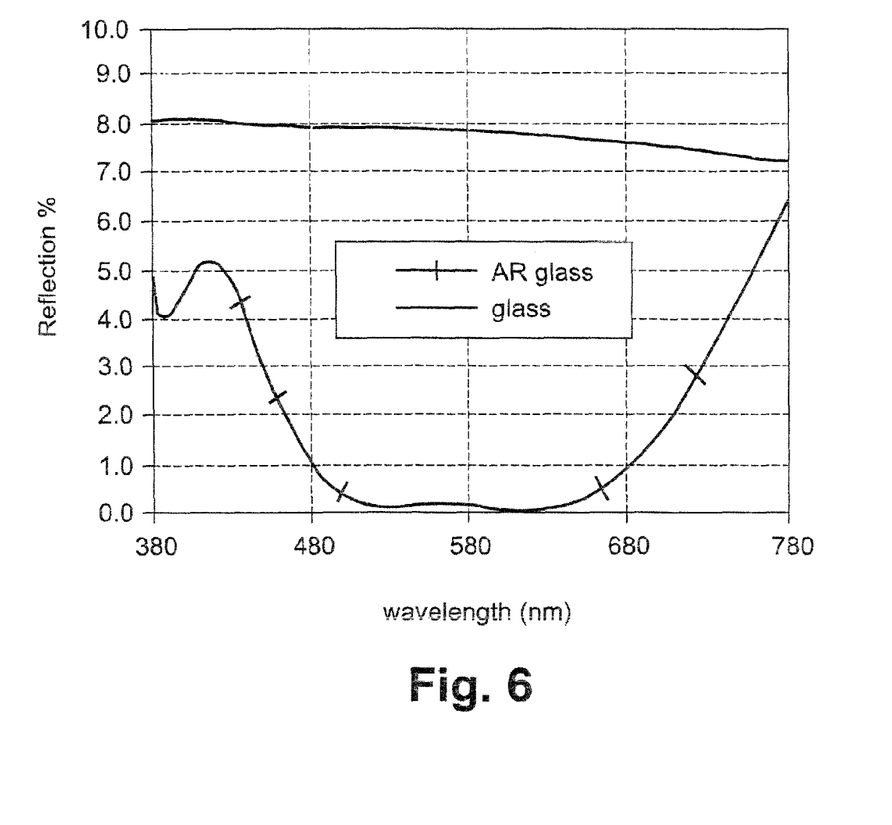
FIG. 6 is a graph illustrating the reflection %, as a function of wavelength, of coated article including a 3-layered AR coating on both sides of a 5 mm thick float glass substrate (soda lime silica glass) (compared to reflection % of an uncoated 5 mm thick similar glass substrate), according to an example embodiment of this invention.

FIG. 6 is a graph illustrating the reflection %, as a function of wavelength, of coated article including a 3-layered AR coating on both sides of a 5 mm thick float glass substrate (soda lime silica glass); compared to reflection % of an uncoated 5 mm thick similar glass substrate. Each of the two AR coatings on the glass substrate were made up of, from the glass substrate outwardly, a 653 angstrom thick base layer of $Ti_{0.28}Si_{0.72}O_2$, then a 959 angstrom thick layer of $Ti_{0.80}Si_{0.20}O_2$, and then on top furthest from the glass substrate a 885 angstrom thick layer of $SiO_2$. Thus, the refractive index of the silicon oxide layer on top was the lowest, and that of the middle layer the highest. The refractive indices of the layers were 1.79, 2.25, and 1.46 for x=0.72, 0.20 and 1.00, respectively. Moreover, this AR coating improved adhesion among the different layers of the coating, and had a wide process window.

Figure 7:
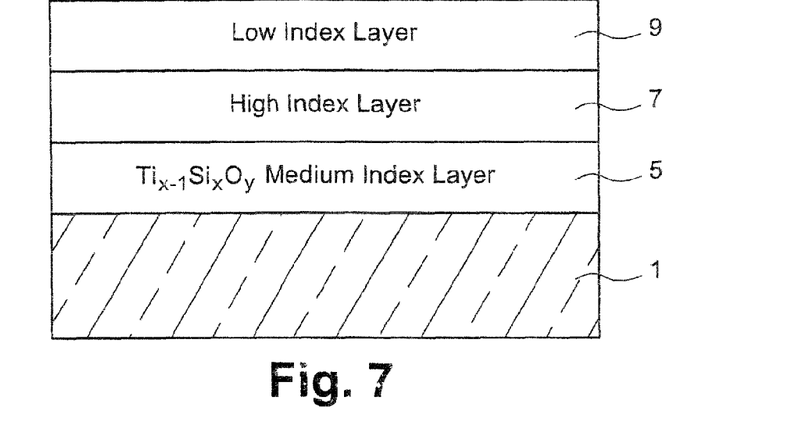
FIG. 7 is a cross-sectional view generally of a coated article comprising an antireflective coating according to certain example embodiments of this invention.

In certain example embodiments, the targets described herein and/or other targets may be used to form a medium index layer comprising $Ti_{x-1}Si_xO_y$. The medium index layer may be a part of a three-layered AR coating as shown in FIG. 7, in certain example embodiments. The $Ti_{x-1}Si_xO_y$-based medium index layer 5 may or may not be produced by sputtering from a $Ti_{x-1}Si_xO_y$-based target, according to different embodiments.

A three-layer AR coating including a medium index layer 5 based on $Ti_{x-1}Si_xO_y$ may be used to replace a single oxynitride-based layer and/or a bi-layer comprising TiOx/SiOx in some instances. In certain example embodiments, when an AR coating consists of a single oxynitride-based layer, the ratio of reactive gases $O_2$ to $N_2$ gas may need to be strictly controlled. Further, in other embodiments, when an AR coating consists of a bi-layer TiOx/SiOx film, the thickness of each layer may need to be precisely controlled during deposition. A three-layer AR coating including a medium index layer 5 based on $Ti_{x-1}Si_xO_y$ may be advantageous in certain example embodiments in that the environment in which it is formed does not necessarily have to be as strictly controlled, and also in that precise thickness control of each layer is not required to the same extent.

In certain example embodiments, the ratio of Si to Ti in layer 5 may impact its refractive index. In some instances, increasing the amount of Si in layer 5 will reduce the refractive index of the layer. However, in certain example embodiments, the silicon oxide in the $Ti_{x-1}Si_xO_y$ based target may have a higher sputter yield than titanium oxide and/or Ti. Therefore, there may be more Si than Ti in the layer, even if the target had approximately equal amounts of Si and Ti (atomically) in the target. In other words, in certain instances, the ratio of Si to Ti (atomically) in the final layer may be greater than the ratio of Si to Ti in the target.

FIG. 7 shows an example embodiment of an antireflection coating on a glass substrate, comprising medium index layer 5, high index layer 7, and low index layer 9. In certain example embodiments, layer 5 comprises $Ti_{x-1}Si_xO_y$, where x is from about 0.05 to 0.95 and y is from about 0.2 to 2, more preferably where x is from about 0.1 to 0.9, and y is from about 1 to 2, and most preferably where x is from about 0.2 to 0.8, and y is from about 1.5 to 2. In other example embodiments, x may be at least about 0.5, or greater than about 0.5. In embodiments where x is greater than or equal to 0.5, the layer may be sputtered by a target comprising more Si than Ti (e.g., atomically). In further example embodiments, x may be greater than or equal to 0.5 even when the target does not comprise more Si than Ti (e.g., atomically).

In other example embodiments, particularly when the target includes Al, $Ti_{x-1}Si_xO_y$-based layer 5 may further include Al and/or an alloy thereof. In further example embodiments, the Si may be replaced entirely by Al and/or an alloy thereof.

In other example embodiments, Zn, Sn, In, alloys thereof (particularly Ti-based alloys), and/or oxides thereof may be used to replace Ti in $Ti_{x-1}Si_xO_y$-based layer 5. Such a replacement may increase the refractive index of the layer in certain example embodiments.

Figure 8:
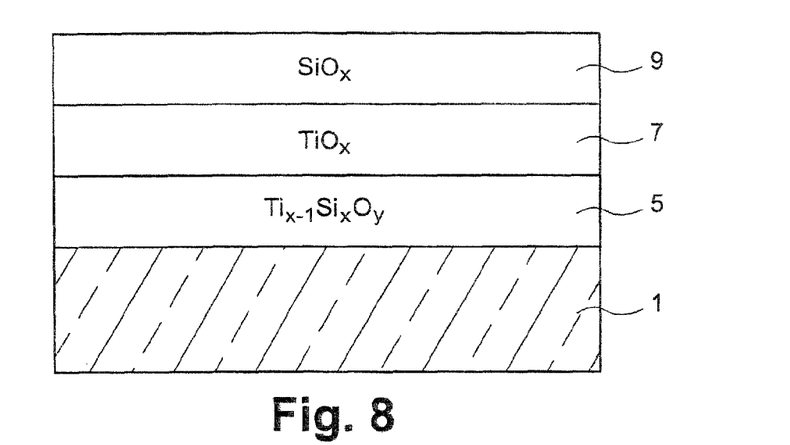
FIG. 8 is another cross-sectional view of a coated article comprising a more specific antireflective coating according to other example embodiments of this invention.

An exemplary embodiment of an AR coating comprising layer 5 as the medium index layer is shown in FIG. 8. A glass substrate is provided. In certain example embodiments, the substrate may be soda lime glass. In other example embodiments, the substrate may be of a different type of glass and/or different type of material. Layer 5 may be sputter deposited from a target as described herein in certain example embodiments. In certain example embodiments, the refractive index of layer 5 may be controlled by the ratio of Si to Ti in the sputtering target. The sputtering target may be ceramic and/or metallic according to different example embodiments.

In certain example embodiments, the refractive index of layer 5 may be from about 1.5 to 2.0, more preferably from about 1.6 to 1.9, and most preferably from about 1.65 to 1.85. In order to achieve a refractive index is one of the aforesaid ranges, the target material may comprise more Si than Ti (atomically and/or by weight). In certain example embodiments, the ratio of Si to Ti in the target may be from about 10:1 to 3:2 (1.5 to 10 times as much Si as Ti), more preferably from about 9:2 to 3:2 (1.5 to 4.5 times as much Si as Ti), and most preferably from about 3:1 to 2:1 (2 to 3 times as much Si as Ti); with an example ratio of Si to Ti in the target being about 7:3 (2.33 times as much Si as Ti). These example ratios are example atomic percentage ratios. In certain example embodiments, during the deposition of layer 5, $O_2$ may be used as the reactive gas. In certain example embodiments, $O_2$ is the only reactive gas used. This may be advantageous in certain example instances in that there may be reduced concern about the index uniformity of the layer across a large area and/or consistency during a long period of production. In certain example embodiments, the ratio of Si to Ti in the layer may be different than the ratio of Si to Ti in the target. In certain example embodiments, the ratio of Si to Ti in the layer may be higher than the ratio of Si to Ti in the target (e.g., atomically and/or by weight).

Layer 5 may have a thickness of from about 20 to 80 nm, more preferably from about 30 to 70 nm, and most preferably from about 40 to 60 nm, with an example ideal thickness being about 50 nm. In certain example embodiments, layer 5 may have a smaller thickness than both of layers 7 and 9.

Layer 7 may be a high index layer in certain example embodiments. In certain examples, layer 7 may be of or include a metal oxide such as, for example, titanium oxide. Layer 7 may be stoichiometric or substoichiometric according to different example embodiments. Layer 7 may have a refractive index of from about 2.0 to 2.6, more preferably from about 2.1 to 2.4. In certain example embodiments, layer 7 may have a thickness of from about 50 to 150 nm, more preferably from about 75 to 125 nm, and most preferably from about 80 to 110 nm, with an example ideal thickness being about 95 nm.

Layer 9 may be a comparatively low index layer in certain example embodiments. The refractive index of layer 9 may be lower than that of both layers 5 and 7 in certain example embodiments. In certain examples, layer 9 may be of or include a metal oxide, a metal nitride, or a metal oxynitride. For instance, in certain example embodiments, layer 9 may be of or include silicon oxide. Layer 9 may be stoichiometric or sub-stoichiometric according to different example embodiments. Layer 9 may have a refractive index of from about 1.3 to 1.6, more preferably from about 1.4 to 1.6. In certain example embodiments, layer 9 may have a thickness of from about 40 to 140 nm, more preferably from about 65 to 115 nm, and most preferably from about 70 to 100 nm, with an example ideal thickness being about 85 nm.

Figure 9:
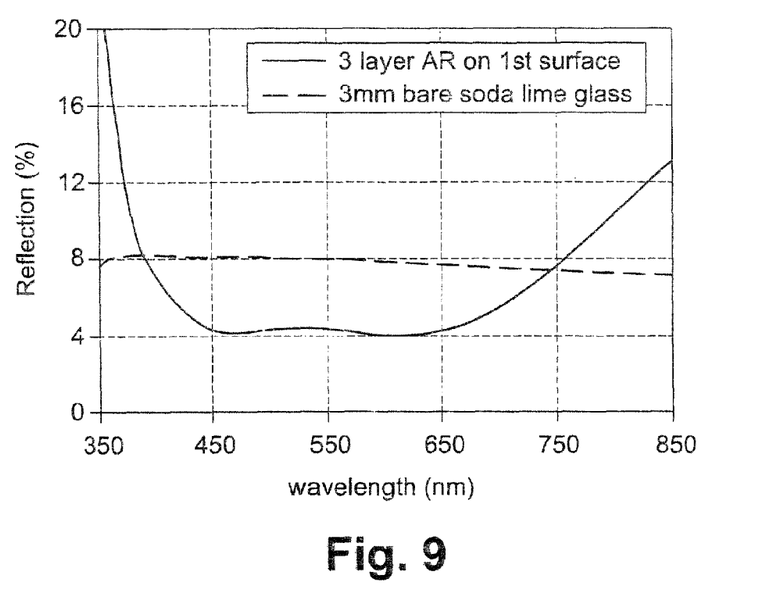
FIG. 9 is a graph of reflection versus wavelength for a coated article according to certain example embodiments of this invention as compared to the reflection of a bare, uncoated glass substrate.

FIG. 9 is a graph of reflection versus wavelength at the surface of a bare soda lime glass substrate and the reflection of a glass substrate with the 3 layer AR coating described above on its first surface. FIG. 9 shows that the reflection is significantly reduced (as compared to an uncoated glass substrate) through the use of a 3 layered AR coating comprising a medium index layer based on $Ti_{1-x}Si_xO_y$. In certain example instances, the reflection is reduced from about 8% in the visible spectrum to about 4% in the visible spectrum. In certain example embodiments, reflection is reduced to less than 8%, more preferably less than 6%, still more preferably less than 5%, and sometimes even to about 4% or even lower, e.g., in the visible spectrum.

In certain example embodiments, medium index layer 5 may be suitable as an AR coating for wavelengths from visible to near, short-wave, and/or mid-wave IR (e.g., to approximately 5,000 nm). Advantageously, certain example embodiments may result in 3-layer AR coating with reduced absorption, e.g., in wavelengths ranging from visible up to and including the mid-IR or any sub-range therein.

In another example of an AR coating incorporating medium index layer 5, layer 5 was of $Ti_{1-x}Si_xO_y$, and had a refractive index of 1.75 and a thickness of approximately 107 nm, layer 7 was of $TiO_x$ and had a thickness of approximately 16 nm, and layer 9 was of $SiO_x$ and had a thickness of approximately 113 nm.

In a further example embodiment of an AR coating incorporating medium index layer 5, layer 5 was of $Ti_{1-x}Si_xO_y$, and had a refractive index of 1.75 and a thickness of approximately 74 nm, layer 7 was of $TiO_x$ and had a thickness of approximately 104 nm, and layer 9 was of $SiO_x$ and had a thickness of approximately 92 nm. Therefore, though preferred thickness ranges are discussed above, there are many suitable thicknesses that will result in a desirable 3-layer AR coating.

Figure 10:
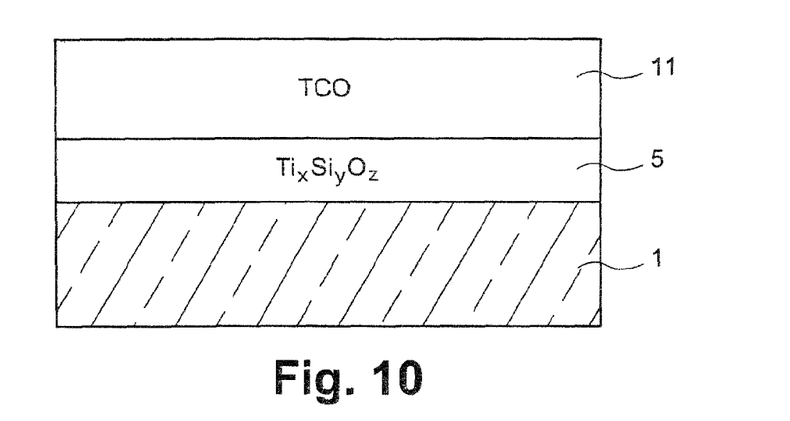
FIG. 10 is a cross-sectional view of a coated article comprising a transparent conductive coating according to certain embodiments of this invention.

FIG. 10 illustrates a different example application of a layer based on $Ti_{1-x}Si_xO_y$. In certain example embodiments, layer 5 may be deposited underneath a transparent conductive oxide layer to be part of a transparent conductive coating. FIG. 10 shows a glass substrate, $Ti_{1-x}Si_xO_y$-based layer 5, with TCO layer 11 formed over layer 5.

An example TCO/TCC coating can be found in U.S. Publication No. 2010/0040892, which is hereby incorporated by reference.

In certain example embodiments, when used with a TCO layer in a transparent conductive coating, layer 5 may have a thickness of from about 40 to 100 nm, more preferably from about 50 to 90 nm, and most preferably from about 60 to 80 nm. TCO layer 11 may have a thickness of from about 100 to 500 nm, more preferably from about 200 to 400 nm, and most preferably from about 250 to 350 nm, in certain embodiments.

The refractive index of layer 5 when used with a TCO layer in a TCC may be from about 1.55 to 1.9, more preferably from about 1.6 to 1.75, and most preferably from about 1.65 to 1.7, with an example refractive index being 1.68, in certain example embodiments. Layer 5 may be substoichiometric with respect to oxygen in certain example embodiments so as to have a reduced effect on the conductivity of the overall coating.

Figure 11:
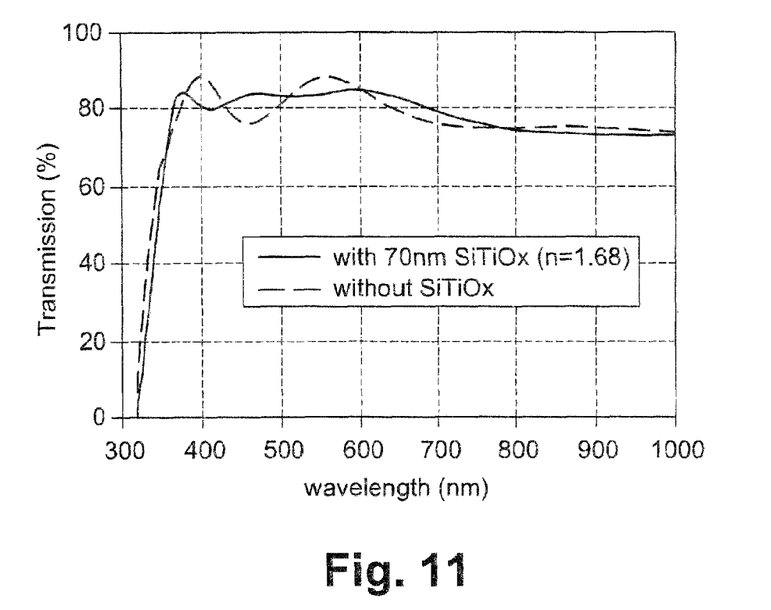
FIG. 11 is a graph of transmission versus wavelength for a coated article comprising a layer made according to certain aspects of this invention, the layer being located underneath a transparent conductive oxide layer, as compared to a transparent conductive coating including only the transparent conductive oxide layer.

FIG. 11 is a graph of transmission versus wavelength for a transparent conductive coating with and without a layer based on titanium silicon oxide located between a TCO layer and the glass substrate. It can be seen from FIG. 11 that the transmission increases when layer 5 is included in the TCC in the 400-500 nm wavelength range, and again in the wavelength range of from about 600 to 800 nm. Therefore, when increased transmission in those ranges is desired, a TCC including a layer comprising $Ti_{1-x}Si_xO_y$, made according to the methods described herein, may be advantageous in certain example embodiments. As can be seen from the FIG. 11 graph, the transmission is roughly the same with and without the SiTiOx layer having an index of refraction of 1.68, for example, at least in the visible spectrum.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A coated article comprising an antireflection coating, wherein the anti-reflection coating comprises:
    a first layer having a medium index of refraction and comprising $Ti_{1-x}Si_xO_y$, where x is greater than or equal to 0.5 and less than 0.95, and having a thickness of from about 30 to 70 nm;
    wherein in said first layer having the medium index of refraction and comprising $Ti_{1-x}Si_xO_y$, y is from 0.2 to 2;
    a second layer having a comparatively higher index of refraction and comprising an oxide of titanium, and having a thickness of from about 80 to 110 nm;
    a third layer having an index of refraction lower than both the first and second layers, and comprising an oxide of silicon, having a thickness of from about 70 to 100 nm;
    wherein the second layer having the comparatively higher index of refraction and comprising the oxide of titanium is thicker than the first layer having the medium index of refraction, and
    wherein the second layer having the comparatively higher index of refraction and comprising the oxide of titanium is thicker than the third layer comprising the oxide of silicon.

2. The coated article of claim 1, wherein said second layer is located over and directly contacting the first layer.

3. The coated article of claim 2, wherein the third layer is located over and directly contacting the second layer.

4. The coated article of claim 1, wherein the second layer comprises $TiO_2$.

5. The coated article of claim 1, wherein the third layer comprises $SiO_2$.

6. The coated article of claim 1, wherein the antireflection coating consists essentially of the first, second and third layers.

* * * * *